United States Patent
Kagaya et al.

(10) Patent No.: US 12,020,900 B2
(45) Date of Patent: Jun. 25, 2024

(54) PLASMA PROCESSING DEVICE, AND PLASMA PROCESSING METHOD

(71) Applicant: TOKYO ELECTRON LIMITED, Tokyo (JP)

(72) Inventors: Munehito Kagaya, Yamanashi (JP); Satoru Kawakami, Yamanashi (JP); Tsuyoshi Moriya, Tokyo (JP); Tatsuo Matsudo, Yamanashi (JP); Jun Yamawaku, Yamanashi (JP); Hiroyuki Onoda, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 385 days.

(21) Appl. No.: 17/440,613

(22) PCT Filed: Mar. 13, 2020

(86) PCT No.: PCT/JP2020/011247
§ 371 (c)(1),
(2) Date: Sep. 17, 2021

(87) PCT Pub. No.: WO2020/195980
PCT Pub. Date: Oct. 1, 2020

(65) Prior Publication Data
US 2022/0165544 A1    May 26, 2022

(30) Foreign Application Priority Data

Mar. 22, 2019 (JP) ................................. 2019-055552

(51) Int. Cl.
*H01J 37/32* (2006.01)
*H01L 21/02* (2006.01)

(52) U.S. Cl.
CPC .... *H01J 37/32174* (2013.01); *H01J 37/3244* (2013.01); *H01J 37/32715* (2013.01);
(Continued)

(58) Field of Classification Search
None
See application file for complete search history.

(56) References Cited

U.S. PATENT DOCUMENTS 9,685,305 B2  6/2017 Maruyama et al.
11,251,052 B2  2/2022 Hoshi et al.
(Continued)

FOREIGN PATENT DOCUMENTS

CN  101042992 A  9/2007
CN  105379428 A  3/2016
(Continued)

OTHER PUBLICATIONS

PCT International Search Report, International Application No. PCT/JP2020/011247, dated May 26, 2020, 11 pages (with English translation of PCT International Search Report).

*Primary Examiner* — Richard H Kim
(74) *Attorney, Agent, or Firm* — Fenwick & West LLP

(57) ABSTRACT

There is provided a plasma processing device. The plasma processing device comprises: a processing chamber; a partition plate that has an insulating property, and configured to partition a space in the processing chamber into a reaction chamber in which an object to be processed is mounted and a plasma generating chamber in which plasma is generated, wherein a first electrode is provided on a surface of the partition plate on the side of the plasma generating chamber, and the partition plate has a plurality of through holes formed for supplying active species contained in the plasma generated in the plasma generating chamber to the reaction chamber; a second electrode disposed in the plasma generating chamber so as to face the first electrode; and a power supply configured to supply high-frequency power obtained by phase-controlling and superimposing high-frequency powers of a plurality of frequencies to one of the first
(Continued)

electrode and the second electrode when the plasma is generated in the plasma generating chamber.

10 Claims, 5 Drawing Sheets

(52) U.S. Cl.
CPC .... *H01L 21/0217* (2013.01); *H01L 21/02274* (2013.01); *H01L 21/0228* (2013.01)

(56) References Cited

U.S. PATENT DOCUMENTS

| | | | |
|---|---|---|---|
| 2003/0111180 A1* | 6/2003 | Nagahata | H01J 37/32183 156/345.43 |
| 2016/0163515 A1 | 6/2016 | Maruyama et al. | |
| 2019/0006188 A1 | 1/2019 | Hoshi et al. | |

FOREIGN PATENT DOCUMENTS

| CN | 109216182 A | 1/2019 |
|---|---|---|
| JP | H5-160045 A | 6/1993 |
| JP | 2001-127045 A | 5/2001 |
| JP | 2011-154973 A | 8/2011 |

\* cited by examiner

PLASMA PROCESSING DEVICE, AND PLASMA PROCESSING METHOD

TECHNICAL FIELD

The present disclosure relates to a plasma processing device and a plasma processing method.

BACKGROUND

Patent Document 1 discloses a plasma processing device configured to convert a raw material gas into plasma, expose the substrate to the plasma, and form a thin film on the substrate. The plasma conversion of the raw material gas may be performed by superimposing a first pulse modulation of 1 kHz or less and a second pulse modulation having a period shorter than that of the first pulse modulation and applying high-frequency power in which harmonic waves are superimposed on a high-frequency waveform subjected to the pulse modulation.

PRIOR ART DOCUMENT

Patent Document

Patent Document 1: Japanese Patent Application Publication No. 1993-160045

SUMMARY

Problems to Be Resolved by the Invention

The present disclosure provides a technique capable of adjusting the density of ions to be irradiated to an object to be processed.

Means of Solving the Problems

A plasma processing device according to one aspect of the present disclosure comprises a processing chamber, a partition plate, a second electrode, and a power supply. The partition plate has an insulating property, and is configured to partition a space in the processing chamber into a reaction chamber in which an object to be processed is mounted and a plasma generating chamber in which plasma is generated. Further, a first electrode is provided on a surface of the partition plate on the side of the plasma generating chamber, and the partition plate has a plurality of through holes formed for supplying active species contained in the plasma generated in the plasma generating chamber to the reaction chamber. The second electrode is disposed in the plasma generating chamber so as to face the first electrode. The power supply is configured to supply high-frequency power obtained by phase-controlling and superimposing high-frequency powers of a plurality of frequencies to one of the first electrode and the second electrode when the plasma is generated in the plasma generating chamber.

Effect of the Invention

According to the present disclosure, it is possible to adjust the density of ions to be irradiated to an object to be processed.

DETAILED DESCRIPTION

Hereinafter, embodiments of the disclosed plasma processing device and plasma processing method will be described in detail with reference to the drawings. In addition, the disclosed plasma processing device and plasma processing method are not limited by the following embodiments.

Meanwhile, plasma atomic layer deposition (ALD) is known as a technique for performing isotropic film formation on a semiconductor wafer (hereinafter also referred to as a "wafer").

However, in such plasma ALD, there may be some cases in which anisotropy in film thickness and film quality arises due to process conditions and equipment. For example, when film formation is performed on a wafer on which a pattern is formed by plasma ALD using a capacitively coupled plasma (CCP) type plasma processing device, relative thinning of sidewalls and deterioration of the film quality with respect to films formed on upper and lower surfaces of the pattern may occur due to the straightness of ions present in plasma.

Accordingly, it is preferable that the density of ions irradiated on a wafer is low in order to realize isotropic film formation by plasma ALD. Meanwhile, in some cases, a plasma processing device is required to perform a process that utilizes ions. Thus, it is required that the plasma processing device is able to adjust the density of ions to be irradiated to the wafer.

[Configuration of Plasma Processing Device]

Figure 1:
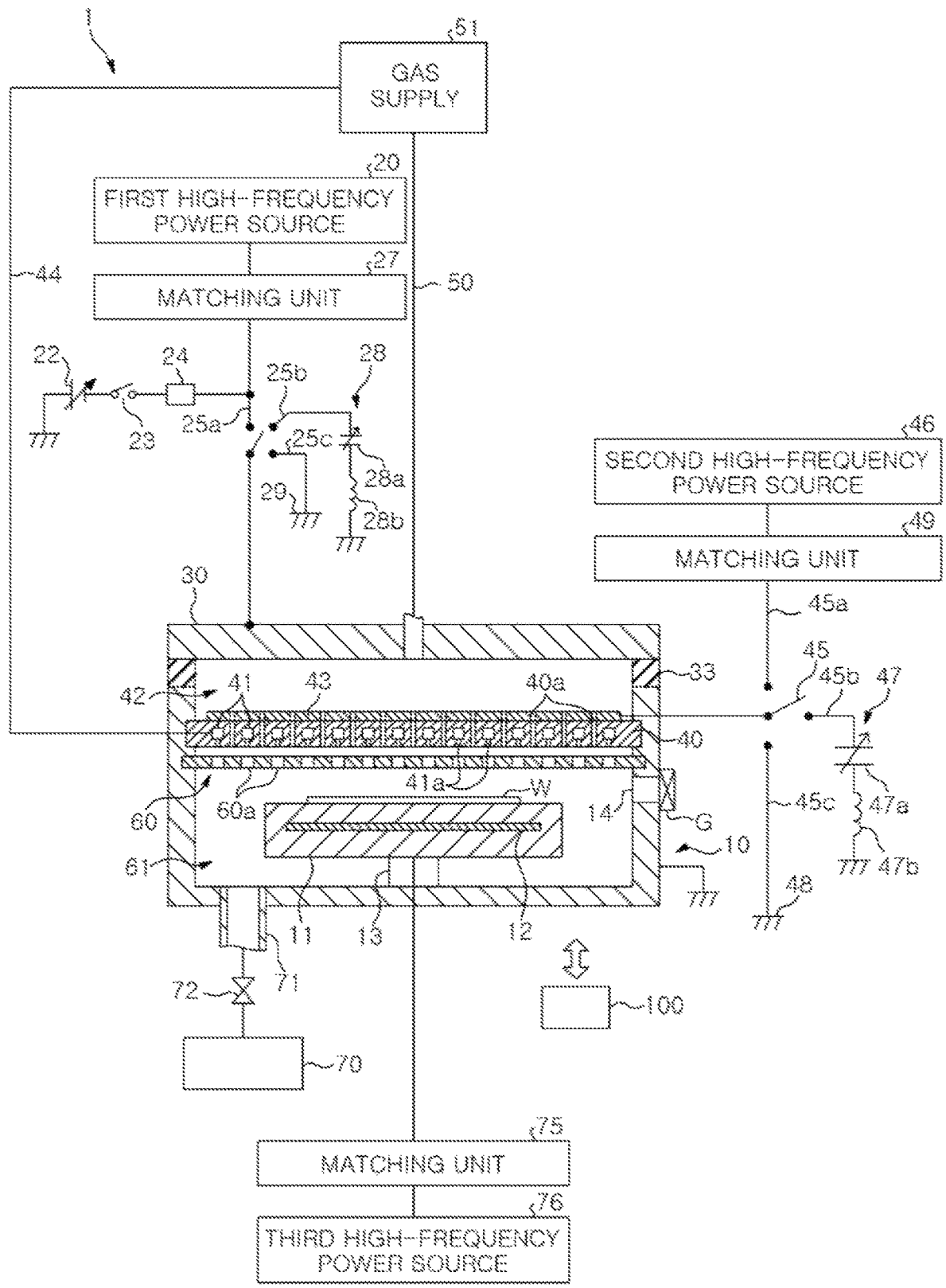
FIG. 1 is a schematic cross-sectional view illustrating an example of a plasma processing device according to an embodiment.

An example of a plasma processing device according to the present embodiment will be described. FIG. 1 is a schematic cross-sectional view illustrating an example of a plasma processing device 1 according to an embodiment. The plasma processing device 1 includes a substantially cylindrical-shaped processing chamber 10 having a bottom and an opened upper side, and a mounting table 11 provided in the processing chamber 10. The processing chamber 10 is grounded. In addition, an inner wall of the processing chamber 10 is covered, for example, with a liner (not shown) having its surface formed of a spray-coated film configured of a plasma resistant material.

The mounting table 11 is formed of, for example, a metal such as nickel. A wafer W is mounted on the mounting table 11. The wafer W is an example of an object to be processed. A lower surface of the mounting table 11 is electrically connected to a support member 13 formed of conductive material, and the mounting table 11 is supported by the support member 13. The support member 13 is supported by a bottom surface of the processing chamber 10. A lower end of the support member 13 is electrically connected to the bottom surface of the processing chamber 10, and is grounded through the processing chamber 10. The lower end of the support member 13 may also be electrically connected to the bottom surface of the processing chamber 10 through a circuit that is adjusted to reduce the impedance between the mounting table 11 and a ground (GND) potential.

A heater 12 is embedded in the mounting table 11, and may heat the wafer W mounted on the mounting table 11 to a predetermined temperature. Further, a flow path (not shown) for circulating a refrigerant may be formed inside the mounting table 11, or a refrigerant whose temperature is controlled by a chiller unit provided outside the processing chamber 10 may be circulated and supplied into the flow path. The mounting table 11 may control the wafer W to a predetermined temperature by heating the wafer W using the heater 12 and cooling the wafer W using the refrigerant supplied from the chiller unit. In addition, the temperature control may be performed only by the refrigerant supplied from the chiller unit without mounting the heater 12.

Further, an electrode may be embedded in the mounting table 11. The mounting table 11 may hold the wafer W placed on an upper surface thereof by an electrostatic force generated by a DC voltage supplied to the electrode. Further, the mounting table 11 is provided with a lifting pin (not shown) for transferring the wafer W to and from a transfer mechanism (not shown) provided outside the processing chamber 10.

An upper electrode 30 formed in a substantially disc shape is provided above the mounting table 11 and on an inner side surface of the processing chamber 10. The upper electrode 30 is supported above the mounting table 11 through an insulating member 33 such as ceramics. Thereby, the processing chamber 10 and the upper electrode 30 are electrically insulated from each other. The upper electrode 30 is formed of, for example, a conductive metal such as nickel (Ni). The upper electrode 30 is an example of a second electrode.

A gas supply pipe 50 is connected to the upper electrode 30. The gas supply pipe 50 is connected to a gas supply 51, and various gases are supplied from the gas supply 51. The gas supplied through the gas supply pipe 50 is diffused within a plasma generating chamber 42 which is below the upper electrode 30. In addition, the gas supply pipe 50 may be branched into a plurality of supply pipes, and gas may be supplied to the plasma generating chamber 42 through a plurality of gas introduction ports. Further, in order to enhance the uniformity of the gas supplied to the plasma generating chamber 42, a gas diffusion space may be provided above the plasma generating chamber 42 having a shower plate therebetween, and the gas may be diffused in the gas diffusion space and may be supplied in a shower form into the plasma generating chamber 42 via the shower plate.

A partition plate 40 configured to partition a space in the processing chamber 10 into the plasma generating chamber 42 and a reaction chamber 61 is provided between the upper electrode 30 and the mounting table 11. The partition plate 40 is disposed in the processing chamber 10 so as to be parallel with the upper electrode 30. The partition plate 40 is formed of, for example, an insulating member such as ceramics. A first plate electrode 43 is provided on an upper surface of the partition plate 40 on the plasma generating chamber 42 side. The first plate electrode 43 is formed of, for example, a metal such as aluminum whose surface is anodized. The first plate electrode 43 is an example of a first electrode.

Further, a second plate electrode 60 is provided between the partition plate 40 and the mounting table 11. The second plate electrode 60 is formed of, for example, a metal such as aluminum whose surface is anodized. In the present embodiment, the second plate electrode 60 is supported by a sidewall of the processing chamber 10. The second plate electrode 60 is electrically connected to the processing chamber 10 and is grounded through the processing chamber 10. That is, the second plate electrode 60 is set to the GND potential.

Figure 2:
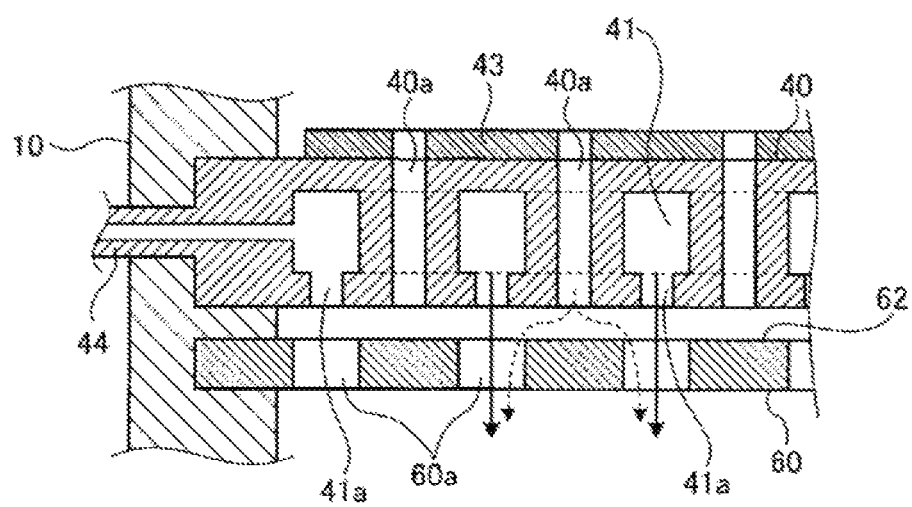
FIG. 2 is an enlarged cross-sectional view for describing an example of a positional relationship between a partition plate and a second plate electrode according to an embodiment.

A description will continue with further reference to FIG. 2. FIG. 2 is an enlarged cross-sectional view for describing an example of a positional relationship between the partition plate 40 and the second plate electrode 60 according to an embodiment. As shown in FIG. 2, for example, a plurality of through holes 40a passing through the partition plate 40 and the first plate electrode 43 in a thickness direction are provided in the partition plate 40 and the first plate electrode 43.

Further, a gas diffusion chamber 41 is provided in the partition plate 40. A plurality of gas discharge ports 41a extending downward are formed in the gas diffusion chamber 41. A gas supply pipe 44 is connected to the gas diffusion chamber 41. The gas supply pipe 44 is connected to the gas supply 51, and various gases are supplied from the gas supply 51. The gas supplied through the gas supply pipe 44 is diffused in the gas diffusion chamber 41 and is discharged from each of the gas discharge ports 41a.

A plurality of through holes 60a passing through the second plate electrode 60 in the thickness direction are formed in the second plate electrode 60. The through holes 60a of the second plate electrode 60 are formed at positions corresponding to positions, at which the through holes 40a of the partition plate 40 and the first plate electrode 43 are not formed, in a horizontal direction. That is, the through holes 60a are formed at positions different from those of the through holes 40a in the horizontal direction. Thereby, the through holes 40a of the partition plate 40 are blocked by the second plate electrode 60 in a vertical direction. The second plate electrode 60 suppresses the penetration of ions from the plasma generating chamber 42 into the reaction chamber 61 via the plurality of through holes 60a. The second plate electrode 60 is an example of a suppression unit.

Further, in addition to the second plate electrode 60, one or more plate electrodes may be added. It is preferable that through holes of the additional plate electrodes are formed at positions different from those of through holes formed in a plate electrode directly above the additional plate electrodes. A potential of the plate electrode is preferably the GND potential.

Figure 6:
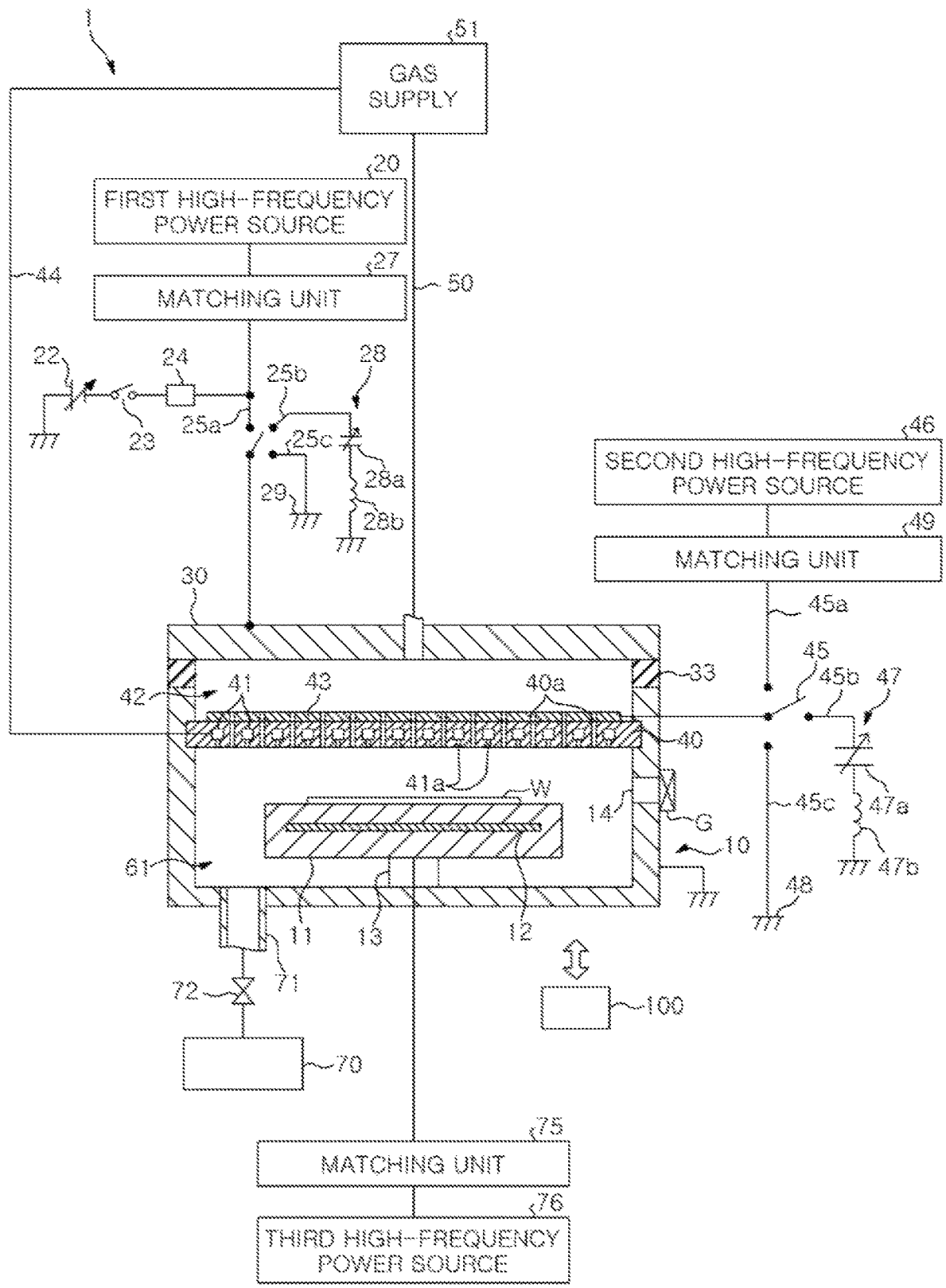
FIG. 6 is a schematic cross-sectional view illustrating another example of the plasma processing device according to an embodiment.

Further, in the plasma processing device 1, as shown in FIGS. 1 and 2, when the second plate electrode 60 is provided between the partition plate 40 and the mounting table 11, the second plate electrode 60 blocks ions from penetrating into the reaction chamber 61 from the plasma generating chamber 42. When ions are allowed to enter the reaction chamber 61 from the plasma generating chamber 42, the second plate electrode 60 may not be provided in the plasma processing device 1. FIG. 6 is a schematic cross-sectional view illustrating another example of the plasma processing device according to an embodiment. The second plate electrode 60 is not provided in the plasma processing device 1 shown in FIG. 6. In this case, the plasma processing device 1 may supply ions generated in the plasma generating chamber 42 to the reaction chamber 61 through the through holes 40a of the first plate electrode 43. In addition, the plasma processing device 1 may control the supply amount of ions by controlling plasma.

Returning back to FIG. 1, the gas supply pipe 50 and the gas supply pipe 44 are connected to the gas supply 51. The gas supply 51 supplies various gases, which are used for plasma processing, to the gas supply pipe 50 and the gas supply pipe 44. For example, the gas supply 51 includes a plurality of gas sources used for plasma processing, a plurality of flow rate controllers such as mass flow controllers, and a plurality of valves. The gas supply 51 adjusts a flow rate of gas supplied from a gas source selected from among the plurality of gas sources, and individually supplies the gas to the gas supply pipe 50 and the gas supply pipe 44. For example, when film formation is performed by plasma ALD, the gas supply 51 individually supplies a raw material gas, a reaction gas, and an inert gas. Specific examples of the raw material gas, the reaction gas, and the inert gas will be described below.

A switch 25 is connected to the upper electrode 30. The switch 25 is capable of selectively switching a connection destination to one of wires 25a to 25c. A first high-frequency power source 20 is electrically connected to the wire 25a through a matching unit 27.

The matching unit 27 is provided with a variable capacitor and an impedance control circuit and is capable of controlling at least one of capacitance and impedance. The matching unit 27 matches a load impedance with an internal impedance of the first high-frequency power source 20.

The first high-frequency power source 20 is capable of generating high-frequency power of one or more frequencies. For example, the first high-frequency power source 20 is capable of generating and supplying high-frequency power of a single frequency in a range of 50 kHz to 220 MHz. Further, the first high-frequency power source 20 is capable of supplying high-frequency power of a tailored voltage waveform (TVW) obtained by phase-controlling and superimposing high-frequency powers of a plurality of frequencies.

Further, the wire 25a is branched between the switch 25 and the matching unit 27 and is connected to a DC power source 22, which is configured to supply a negative DC voltage, through a filter 24 and a switch 23. The filter 24 suppresses a high-frequency component of the DC voltage supplied from the DC power source 22 through the switch 23, and also suppresses high-frequency power flowing from the first high-frequency power source 20 to the DC power source 22.

An LC circuit 28 is provided in the wire 25b. The LC circuit 28 includes, for example, a variable capacitor 28a and an inductor 28b connected in series. The LC circuit 28 makes a potential of the upper electrode 30 become close to the GND potential by adjusting the capacitance of the variable capacitor 28a. The LC circuit 28 is capable of changing characteristics such as a resonance frequency by adjusting the capacitance of the variable capacitor 28a. The capacitance of the variable capacitor is controlled by a control device 100, which will be described below. In addition, the LC circuit 28 may include a capacitor, which has a fixed capacitance, and a variable inductor, whose inductance value is variable, connected in series.

The wire 25c is connected to GND 29.

The switch 25 may switch a connection destination of the upper electrode 30 to one of the first high-frequency power source 20, the LC circuit 28, and the GND 29 by selectively switching the connection destination to one of the wires 25a to 25c.

A switch 45 is connected to the first plate electrode 43. The switch 45 is capable of selectively switching a connection destination to one of wires 45a to 45c. A second high-frequency power source 46 is electrically connected to the wire 45a through a matching unit 49.

The matching unit 49 is provided with a variable capacitor and an impedance control circuit and is capable of controlling at least one of capacitance and impedance. The matching unit 49 matches a load impedance with an internal impedance of the second high-frequency power source 46.

Similar to the first high-frequency power source 20, the second high-frequency power source 46 is capable of generating high-frequency power of one or more frequencies. For example, the second high-frequency power source 46 is capable of generating and supplying high-frequency power of a single frequency in a range of 50 kHz to 220 MHz. In addition, the second high-frequency power source 46 is capable of supplying high-frequency power of a TVW obtained by phase-controlling and superimposing high-frequency powers of a plurality of frequencies.

An LC circuit 47 is provided in the wire 45b. The LC circuit 47 includes, for example, a variable capacitor 47a and an inductor 47b connected in series. The LC circuit 47 makes a potential of the partition plate 40 become close to the GND potential by adjusting the capacitance of the variable capacitor 47a. The LC circuit 47 is capable of changing characteristics such as a resonance frequency by adjusting the capacitance of the variable capacitor 47a. The capacitance of the variable capacitor is controlled by the control device 100, which will be described below. In addition, the LC circuit 47 may include a capacitor, which has a fixed capacitance, and a variable inductor, whose inductance value is variable, connected in series.

The wire 45c is connected to GND 48.

The switch 45 may switch a connection destination of the first plate electrode 43 to one of the second high-frequency power source 46, the LC circuit 47, and the GND 48 by selectively switching the connection destination to one of the wires 45a to 45c.

Further, in the plasma processing device 1 according to an embodiment, a third high-frequency power source 76 may be electrically connected to the mounting table 11 through a matching unit 75. The matching unit 75 is provided with a variable capacitor and an impedance control circuit and is capable of controlling at least one of capacitance and impedance. The matching unit 75 matches a load impedance with an internal impedance of the third high-frequency power source 76. The plasma processing device 1 may increase the amount of ions passing through the plasma generating chamber 42 by applying a voltage to the mounting table 11 using the third high-frequency power source 76. Further, the plasma processing device 1 generates plasma in the reaction chamber 61 by applying the voltage from the third high-frequency power source to the mounting table 11 to perform, for example, a thin-film modification process using plasma directly, anisotropic etching, and atomic layer etching.

An exhaust device 70 configured to exhaust the inside of the processing chamber 10 is connected to the bottom surface of the processing chamber 10 through an exhaust pipe 71. An adjustment valve 72 configured to adjust an exhaust amount of the exhaust device 70 is provided at the exhaust pipe 71. By operating the exhaust device 70, the gas in the processing chamber 10 is exhausted through the exhaust pipe 71, and an opening degree of the adjustment valve 72 is controlled such that the inside of the processing chamber 10 is depressurized to a predetermined degree of vacuum.

An opening 14 configured to load and unload the wafer W is formed in the sidewall of the processing chamber 10. The opening 14 is opened and closed by a gate valve G.

Each unit of the plasma processing device 1 is controlled by the control device 100. The control device 100 includes a memory and a processor. The processor controls each unit of the plasma processing device 1 by reading and executing programs and recipes stored in the memory. In the present embodiment, the control device 100 controls each unit of the plasma processing device 1 to form a film on the wafer W, which is placed on the mounting table 11, by plasma ALD.

Next, a specific example of plasma processing using the plasma processing device 1 will be described. In the following description, a case in which film formation is performed by plasma ALD using the plasma processing device 1 will be described.

For example, the wafer W is placed on the mounting table 11, and after the gate valve G is closed, the control device 100 operates the exhaust device 70 and adjusts an opening degree of the adjustment valve 72 to reduce a pressure in the processing chamber 10 to a predetermined degree of vacuum. In addition, the control device 100 controls the gas supply 51 to supply a raw material gas for film formation, a reaction gas, and an inert gas to perform plasma ALD.

Here, when an $SiO_2$ film is formed, for example, an aminosilane gas such as bis-diethylamino silane (BDEAS), diisopropyl amino silane (DIPAS), dimethylamino silane (DMAS), tri-dimethyl amino silane (TDMAS), or the like is used as the raw material gas. As the reaction gas, an oxidizing gas such as oxygen ($O_2$) gas may be used. As the inert gas, argon (Ar) gas, helium (He) gas, or the like may be used.

Further, when a $TiO_2$ film is formed, for example, titanium tetrachloride ($TiCl_4$), tetra (isopropoxy) titanium (TTIP), titanium tetrabromide ($TiBr_4$), titanium tetraiodide ($TiI_4$), tetrakis ethylmethylamino titanium (TEMAT), tetrakis dimethylamino titanium (TDMAT), tetrakis diethylamino titanium (TDEAT), or the like may be used as the raw material gas. As the reaction gas, an oxidizing gas such as oxygen ($O_2$) gas may be used. As the inert gas, nitrogen ($N_2$) gas, Ar gas, He gas, or the like may be used.

Further, when an SiN film is formed, for example, an aminosilane gas such as bis-diethylamino silane (BDEAS), diisopropyl amino silane (DIPAS), dimethylamino silane (DMAS), tri-dimethyl amino silane (TDMAS), or the like, and a halide gas such as dichlorosilane (DCS), hexachlorodisilane (HCDS), diiodosilane (DIS), or the like may be used as the raw material gas. As the reaction gas, $N_2$ gas, $NH_3$ gas, or the like may be used. As the inert gas, Ar gas, He gas, or the like may be used.

For example, the control device 100 performs an adsorption process. In the adsorption process, the raw material gas is supplied from the gas supply 51 to the gas diffusion chamber 41 through the gas supply pipe 44. The raw material gas supplied through the gas supply pipe 44 is diffused within the gas diffusion chamber 41 and supplied in a shower form into the reaction chamber 61 from each of the gas discharge ports 41a. Molecules of the raw material gas supplied into the reaction chamber 61 are adsorbed on a surface of the wafer W placed on the mounting table 11. In addition to the raw material gas itself, radicals dissociated by plasma or pyrolyzed precursors may be supplied to the surface of the wafer W.

Next, the control device 100 stops the supply of the raw material gas from the gas supply 51. Then, the control device 100 performs a first purge process. In the first purge process, the inert gas is supplied from the gas supply 51 into the plasma generating chamber 42 and the gas diffusion chamber 41 through the gas supply pipe 50 and the gas supply pipe 44. The inert gas supplied into the plasma generating chamber 42 and the gas diffusion chamber 41 is supplied in a shower form into the reaction chamber 61 through the through holes 40a of the partition plate 40 and the through holes 60a of the second plate electrode 60. The raw material gas remaining in the gas supply 51, the gas supply pipe 44, the gas diffusion chamber 41, and the reaction chamber 61 and the molecules of the raw material gas excessively adsorbed on the surface of the wafer W may be removed due to the inert gas supplied to the reaction chamber 61.

Next, the control device 100 stops the supply of the inert gas from the gas supply 51. Then, the control device 100 performs a reaction process. In the reaction process, the reaction gas is supplied from the gas supply 51 into the plasma generating chamber 42 through the gas supply pipe 50. The reaction gas supplied into the plasma generating chamber 42 is diffused within the plasma generating chamber 42.

Further, the control device 100 controls the first high-frequency power source 20, the switch 25, the second high-frequency power source 46, and the switch 45 to apply high-frequency power to the upper electrode 30 and the first plate electrode 43. In addition, the control device 100 controls the switch 23 to be turned on and superimposes a negative DC voltage of a predetermined magnitude supplied from the DC power source 22 on the high-frequency power.

Here, in the present embodiment, a combination of voltages applied to the upper electrode 30 and the first plate electrode 43 is divided into the following six patterns.

A first pattern: high-frequency power of a single frequency is applied to the upper electrode 30, and high-frequency power of a TVW is applied to the first plate electrode 43.

A second pattern: the high-frequency power of a single frequency and the high-frequency power of a TVW are superimposed and applied to the upper electrode 30, and the first plate electrode 43 is connected to the GND 48 or the LC circuit 47.

A third pattern: the high-frequency power of a TVW is applied to the upper electrode 30, and the first plate electrode 43 is connected to the GND 48 or the LC circuit 47.

A fourth pattern: the high-frequency power of a TVW is applied to the upper electrode 30, and the high-frequency power of a single frequency is applied to the first plate electrode 43.

A fifth pattern: the upper electrode 30 is connected to the GND or the LC circuit, and the high-frequency power of a single frequency and the high-frequency power of a TVW are superimposed and applied to the first plate electrode 43.

A sixth pattern: the upper electrode 30 is connected to the GND or the LC circuit, and the high-frequency power of a TVW is applied to the first plate electrode 43.

In the case of the first pattern and the fourth pattern, the control device 100 connects the switch 25 to the wire 25a connected to the first high-frequency power source 20 and connects the switch 45 to the wire 45a connected to the second high-frequency power source 46. In addition, in the case of the second pattern or the third pattern, the control device 100 connects the switch 25 to the wire 25a connected to the first high-frequency power source 20 and connects the switch 45 to the wire 45c connected to the GND 48 or the wire 45b connected to the LC circuit 47. In addition, in the case of the fifth pattern or the sixth pattern, the control device 100 connects the switch 25 to the wire 25c connected to the GND 29 or the wire 25b connected to the LC circuit 28 and connects the switch 45 to the wire 45a connected to the second high-frequency power source 46. In addition, the control device 100 controls the first high-frequency power source 20 and the second high-frequency power source 46 and applies the high-frequency power of a single frequency and the high-frequency power of a TVW to the upper electrode 30 and the first plate electrode 43 according to the first to sixth patterns. Specifically, the high-frequency power of a TVW is generated by phase-controlling and superimposing high-frequency voltages of different frequencies. For example, the first high-frequency power source 20 and the second high-frequency power source 46 generate the high-frequency power of a TVW by controlling the phase of one or more high-frequency powers having a frequency that is an integral multiple of a fundamental wave and superimposing the resultant on the high-frequency power of the fundamental wave. Examples of the frequencies superimposed in the TVW include the following frequency combinations, where f is the frequency of the fundamental wave.

f+2f
f+3f+5f
f+2f+3f

The frequency f of the fundamental wave is preferably in a range of 100 kHz to 100 MHz. In a case of negative plasma, it is preferable that the frequency is low, for example, 400 kHz. On the other hand, in a case of positive plasma, it is preferable that the frequency is high, for example, 60 MHz. The phase is preferably 270° when the high-frequency power is applied to the upper electrode 30, and 90° when the high-frequency power is applied to the first plate electrode 43 or the mounting table 11.

The high-frequency power of a single frequency is preferably in a range of 100 kHz to 220 MHz. In the case of negative plasma, it is preferable that the frequency is low, for example, 400 kHz. On the other hand, in the case of positive plasma, it is preferable that the frequency is high, for example, 60 MHz.

The high-frequency power applied to the upper electrode and the first plate electrode 43 is radiated into the plasma generating chamber 42. Thus, in the plasma generating chamber 42, plasma of the reaction gas is generated. The plasma generated in the plasma generating chamber 42 contains electrons, ions, and active species.

The plasma processing device 1 may control a thickness of a plasma sheath formed in the plasma generating chamber 42 by controlling the phase and the combination of the frequencies superimposed as the high-frequency power of a TVW. The thickness of the plasma sheath is changed depending on factors such as an area ratio between a region to which the voltage is applied and a GND region, a shape of a voltage wave to be applied, a phase difference between a fundamental wave and a harmonic wave, and which of the fundamental wave and the harmonic wave becomes phase shifted. The area ratio between the region to which the voltage is applied and the GND region is determined by a shape of the plasma processing device 1, and thus, in practice, the thickness of the plasma sheath is controlled by changing the other factors. For example, when f and 2f are superimposed, the thickness of the plasma sheath is changed periodically when a phase difference between a fundamental wave f and a harmonic wave 2f is changed. Further, when an amplitude or a voltage waveform shape (e.g., a sine wave or a cosine wave) of the fundamental wave and the harmonic wave is changed, an amount of change in the thickness of the plasma sheath and a phase of the periodic change in the thickness of the plasma sheath are changed. When the thickness of the plasma sheath is changed, the acceleration of charged particles such as electrons and ions is changed. Accordingly, the control device 100 may control the energy of the charged particles contained in the plasma by controlling the high-frequency power of a TVW to change the thickness of the plasma sheath. For example, by changing the thickness of the plasma sheath, the energy of ions in the plasma may be changed. Thus, it is possible to select the optimum contribution of ions by selecting the optimum thickness of the plasma sheath in consideration of the desired purpose. It is also possible to independently control an electron temperature, electron density, radical dissociation, and ion energy by a TVW, and these parameters may be controlled independently according to the process.

The first plate electrode 43 receives heat from the plasma and generates heat. Further, a surface of the first plate electrode 43 is consumed as charged particles such as electrons or ions are accelerated and incident on the surface. However, by reducing the thickness of the plasma sheath, the amount of heat received from the plasma may be reduced. In addition, by reducing the thickness of the plasma sheath to lower the energy of the charged particles, the consumption of the first plate electrode 43 may be suppressed.

Further, in the case of the second pattern and the third pattern, when the first plate electrode 43 is connected to the GND 48, electric charges of the charged particles such as electrons and ions in contact with the surface of the first plate electrode 43 are neutralized. In addition, the charged particles not in contact with the surface of the first plate electrode 43 pass through the through holes 40a of the first plate electrode 43. Here, for example, as shown in FIG. 2, the through holes 40a in the present embodiment are blocked in the vertical direction by the second plate electrode 60. Accordingly, the charged particles passing through the through holes 40a come into contact with an upper surface 62 of the second plate electrode 60. In addition, at the upper surface 62 of the second plate electrode 60, the electric charges of the ions are neutralized by the electric charges of the electrons. Accordingly, ions penetrating into the reaction chamber 61 through the through holes 60a of the second plate electrode 60 are reduced. Thereby, damage to the wafer W caused by the ions is reduced.

Meanwhile, when the second plate electrode 60 is not provided as shown in FIG. 6, the charged particles generated in the plasma generating chamber 42 are not blocked by the second plate electrode 60, and thus, the charged particles may be supplied to the reaction chamber 61 through the through holes 40a of the first plate electrode 43. Further, by applying the voltage from the third high-frequency power source 76 to the mounting table 11, the amount of ions passing through the plasma generating chamber 42 may be increased.

The ion transmittance may be adjusted and the density of ions irradiated to the wafer W may be adjusted in the first to sixth patterns. In addition, the thickness of the plasma sheath may be controlled in the first to sixth patterns. Thus, by reducing the thickness of the plasma sheath, the amount of heat received from the plasma may be reduced. Further, by reducing the thickness of the plasma sheath to lower the energy of the charged particles, the consumption and heat generation of the first plate electrode 43 may be suppressed. In particular, in the first pattern, the fifth pattern, and the sixth pattern, controllability of ion transmittance is high. On the other hand, in the second pattern, the third pattern, and the fourth pattern, the amount of change in ion transmittance is relatively small, and dissociation control may be performed by priority.

Further, in the first pattern, or the second pattern and the third pattern, when the first plate electrode 43 is connected to the LC circuit 47, the amount of ions being blocked by the electric charges of the charged particles of the first plate electrode 43 can be adjusted, so that the density of ions entering the reaction chamber 61 may be adjusted.

Meanwhile, the active species contained in the plasma is electrically neutral, and thus a path of the active species is not affected by the potential of the first plate electrode 43 or the second plate electrode 60, so that the active species may be supplied in the same manner as unionized gas. Thus, for example, as shown by a dotted line arrow in FIG. 2, the active species entering the through holes 40a of the first plate electrode 43 is supplied into the reaction chamber 61 through the through holes 60a of the second plate electrode 60. The active species supplied into the reaction chamber 61 reacts with the molecules of the raw material gas above the wafer W to form a film.

Next, the control device 100 stops the supply of the reaction gas from the gas supply 51. Further, the control device 100 controls the first high-frequency power source 20 and the second high-frequency power source 46 to stop the application of the high-frequency power to the upper electrode 30 and the first plate electrode 43, and controls the switch 45 to be turned off. In addition, the control device 100 stops the application of the negative DC voltage from the DC power source 22 to the upper electrode 30 by controlling the switch 23 to be turned off. In addition, the control device 100 performs a second purge process. In the second purge process, the inert gas is supplied from the gas supply 51 into the plasma generating chamber 42 and the gas diffusion chamber 41 via the gas supply pipe 50 and the gas supply pipe 44. The inert gas supplied into the plasma generating chamber 42 and the gas diffusion chamber 41 is supplied in a shower form into the reaction chamber 61 via the through holes 40a of the partition plate 40 and the through holes 60a of the second plate electrode 60. The reaction gas and volatile reaction by-products remaining on the surface of the wafer W may be removed due to the inert gas supplied to the reaction chamber 61.

The control device 100 forms a film having a predetermined film thickness on the surface of the wafer W by repeating the adsorption process, the first purge process, the reaction process, and the second purge process for a predetermined number of cycles.

As described above, the plasma processing device 1 according to the present embodiment may control the density of ions supplied to the reaction chamber 61. Thus, in the plasma processing device 1, for example, when film formation is performed on the wafer W on which a pattern is formed, the density of ions entering the reaction chamber 61 is lowered, so that a case in which sidewalls of the pattern are relatively thinned and film quality is deteriorated may be suppressed. Further, in the plasma processing device 1, since the density of ions may be controlled, it is also possible to perform a process that utilizes ions.

Here, when the case of dividing only the plasma generating chamber 42 and the reaction chamber 61 is considered, it is also conceivable to adopt a so-called remote plasma configuration in which the plasma generating chamber 42 and the reaction chamber 61 are implemented in separate devices and the plasma generating chamber 42 and the reaction chamber 61 are connected through a pipe. However, in this case, the active species contained in the plasma may be deactivated in a process of flowing through the pipe, and it is difficult to supply a sufficient amount of active species into the reaction chamber 61.

On the other hand, in the plasma processing device 1 of the present embodiment, the plasma generating chamber 42 and the reaction chamber 61 are adjacent to each other with the partition plate 40 interposed therebetween. Thus, a large amount of active species contained in the plasma generated in the plasma generating chamber 42 may be guided to the reaction chamber 61 without being deactivated.

Further, in the case when only a large amount of active species is supplied, it is also considerable to generate plasma by a plasma generation method such as an inductively coupled plasma (ICP) or a surface wave plasma (SWP), which has a higher electron density than CCP. However, in the plasma generation method such as the ICP or SWP, it is necessary to make a volume of the plasma generating chamber 42 larger than that in the CCP method. For this reason, when a plasma generation method such as the ICP or SWP is applied to a film forming method such as ALD in which a gas replacement time greatly affects processing throughput, it is difficult to improve the throughput.

In contrast, according to the plasma processing device 1 of the present embodiment, since plasma is generated by the CCP method, the volume of the plasma generating chamber 42 may be reduced as compared with the plasma generation method such as the ICP or SWP. Thereby, gas replacement may be realized at a higher speed, and the throughput of film-forming processing by ALD may be improved.

Next, an example of a semiconductor process using the plasma processing device 1 will be described. With the miniaturization and complexity in the semiconductor process, the difficulty of a gap-filling process for filling a trench or a hole is increasing. For example, in the gap-filling process, it is necessary to uniformly and seamlessly fill with SiN a trench or hole structure having an opening of several tens of nm or less and an aspect ratio of 10 or more.

An SiN film may be isotropically formed and filled in for such fine and high aspect ratio structure. In this case, the film formation starts and progresses from both walls of the trench or an outer peripheral portion of the hole, and finally, the opposing SiN films come into contact with each other to complete the filling. However, in this case, a seam may be formed in the finally contacting portion. In the portion in which the seam is present, there may be cases in which film quality is different in comparison with other portions. For example, etching may proceed preferentially from the seam portion in a subsequent process, resulting in a device defect. Further, when conventional film formation using plasma is performed, a phenomenon in which a film formation rate at an upper portion of the trench or hole is higher than that at a lower portion thereof occurs due to the deactivation of radicals contributing to an oxidation or nitridation reaction. In such a case, the upper portion of the trench or hole is first filled, and the film formation is not sufficiently performed on the lower portion thereof. In particular, when the trench or hole is formed in a bow shape, whose upper portion is narrower than the middle, by the influence of the etching performed in the previous process, a large amount of film is formed on the upper portion of the trench or hole, and thus it becomes more difficult to uniformly and seamlessly fill the trench or hole.

In order to solve this problem, it is necessary to perform bottom-up film formation from the bottom of the trench or hole. In conventional oxide film or nitride film formation, it is difficult to intentionally make a difference in film formation rate between a side surface and the bottom of a pattern, and thus, it is difficult to perform complete bottom-up film formation.

Meanwhile, by performing a deposition-etch-deposition (DED) process in which film formation and etching are alternately performed, top and side films which interfere with the filling process may be removed, and pseudo bottom-up film formation may be realized. Hereinafter, an example will be described in which pseudo bottom-up film formation is performed by performing a DED process using the plasma processing device 1 according to the present embodiment.

FIG. 3 is a diagram illustrating an example of a change in a pattern by a DED process according to an embodiment. In FIG. 3, a wafer W is shown. A pattern 81 in which a hole 82 is formed is provided on the wafer W.

Figure 3A:
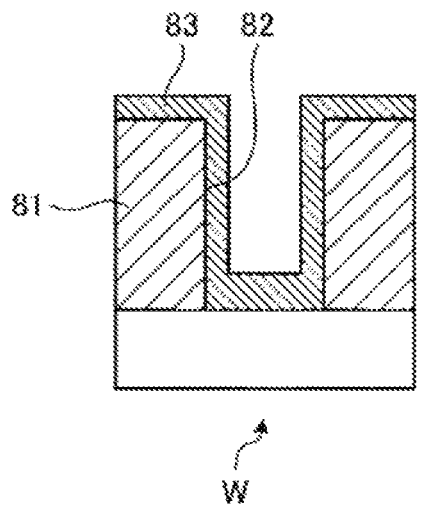
FIG. 3 is a diagram illustrating an example of a change in a pattern by a deposition-etch-deposition (DED) process according to an embodiment.

As shown in FIG. 3A, an SiN film 83 is isotropically formed on the wafer W. For example, the plasma processing device 1 according to the present embodiment forms the SiN film 83 by performing plasma ALD with the high-frequency power of the above-described first pattern. In the first pattern, the density of ions entering the reaction chamber 61 is reduced, so that the SiN film 83 is uniformly formed as shown in FIG. 3A.

Figure 3B:
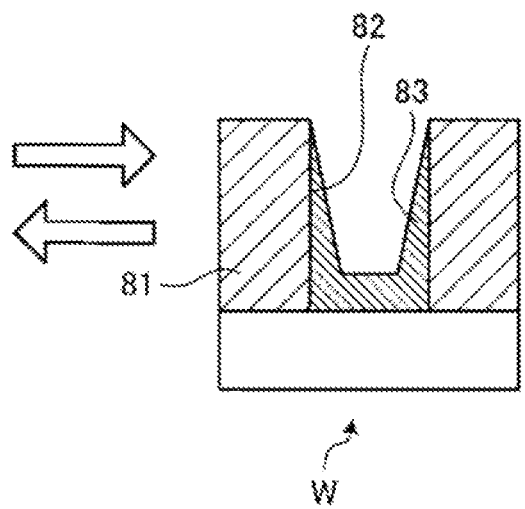

Next, anisotropic etching is performed on the SiN film 83. The anisotropic etching may be performed by the plasma processing device 1 or another plasma processing device. For example, when the etching is performed by the plasma processing device 1 according to the present embodiment, the control device 100 supplies an etching gas, such as $NF_3$ and $H_2$, to the gas supply pipe 44 from the gas supply 51. The etching gas supplied to the gas supply pipe 44 is diffused in the gas diffusion chamber 41 and is supplied in a shower form into the reaction chamber 61 from each of the gas discharge ports 41a. In addition, the control device 100 connects the switch 45 to the wire 45a connected to the second high-frequency power source 46 and controls the second high-frequency power source 46 to apply high-frequency power of a single frequency in a range of 50 kHz to 220 MHz or high-frequency power obtained by superimposing a plurality of frequencies to the second plate electrode 60. When the flow rate and pressure of radicals to be supplied are adjusted and the radicals are controlled not to fully reach a lower portion of the pattern (to deactivate in the middle of the pattern), as shown in FIG. 3B, an upper portion of the SiN film 83 is etched more so that more of the film remains as it goes to a lower portion of the hole 82. In the DED process, pseudo bottom-up formation of the SiN film 83 may be realized by alternately repeating the film formation and the etching described above.

FIG. 4 is a diagram illustrating another example of the change in the pattern by a DED process according to an embodiment. A wafer W similar to that in FIG. 3 is shown in FIG. 4.

Figure 4A:
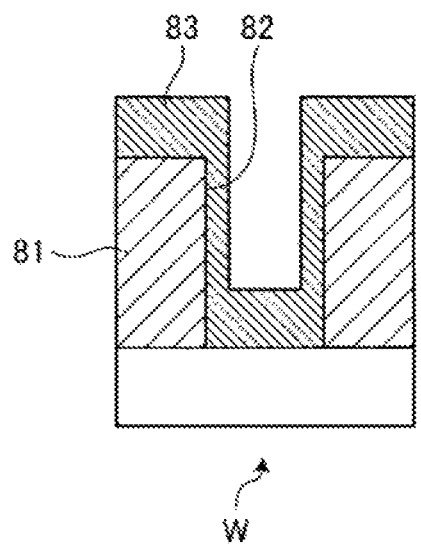
FIG. 4 is a diagram illustrating another example of the change in the pattern by the DED process according to an embodiment.

As shown in FIG. 4A, an SiN film 83 is anisotropically formed on the wafer W. Anisotropic film formation may be performed by the plasma processing device 1 or another plasma processing device. For example, conventional plasma ALD is performed by the plasma processing device 1 according to the present embodiment. For example, the control device 100 performs the adsorption process, the first purge process, and the second purge process of the plasma ALD according to the present embodiment. Further, in the reaction process according to the present embodiment, the control device 100 supplies a reaction gas from the gas supply 51 to the gas supply pipe 44. In addition, the control device 100 connects the switch 45 to the wire 45a connected to the second high-frequency power source 46 and controls the second high-frequency power source 46 to apply high-frequency power of a single frequency in a range of 50 kHz to 220 MHz or high-frequency power obtained by superimposing a plurality of frequencies to the second plate electrode 60. Thereby, plasma of the reaction gas is generated in the reaction chamber 61, and the SiN film 83 is formed on the wafer W. The SiN film 83 is formed to be thinner on a sidewall portion of a hole 82 due to the straightness of ions present in the plasma.

Figure 4B:
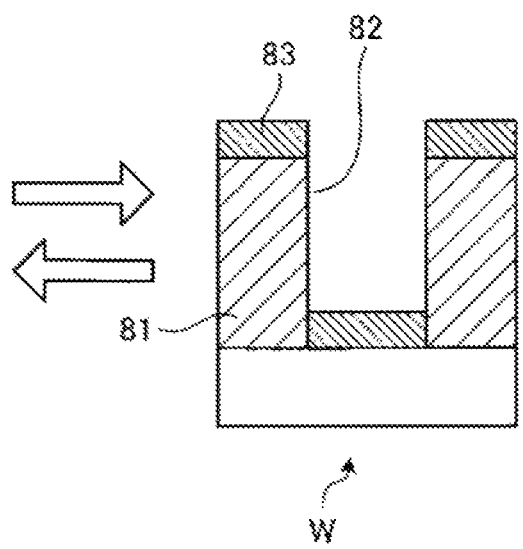

Next, isotropic etching is performed on the SiN film 83. The isotropic etching may be performed by the plasma processing device 1 or another plasma processing device. For example, plasma ALD is performed by the plasma processing device 1 according to the present embodiment. When process parameters such as a flow rate and pressure of radicals to be supplied are adjusted and the radicals are controlled to fully reach the lower portion of the pattern (such that isotropic etching is performed), as shown in FIG. 4B, a large amount of the SiN film 83 remains on the lower portion of the hole 82 and an upper surface of a pattern 81. In the DED process, pseudo bottom-up formation of the SiN film 83 may be realized by alternately repeating the film formation and the etching described above. Further, the isotropic etching may be etching using heat without using plasma. In addition, the isotropic etching may be etching using a chemical solution under an atmospheric pressure atmosphere.

[Plasma Processing]

Figure 5:
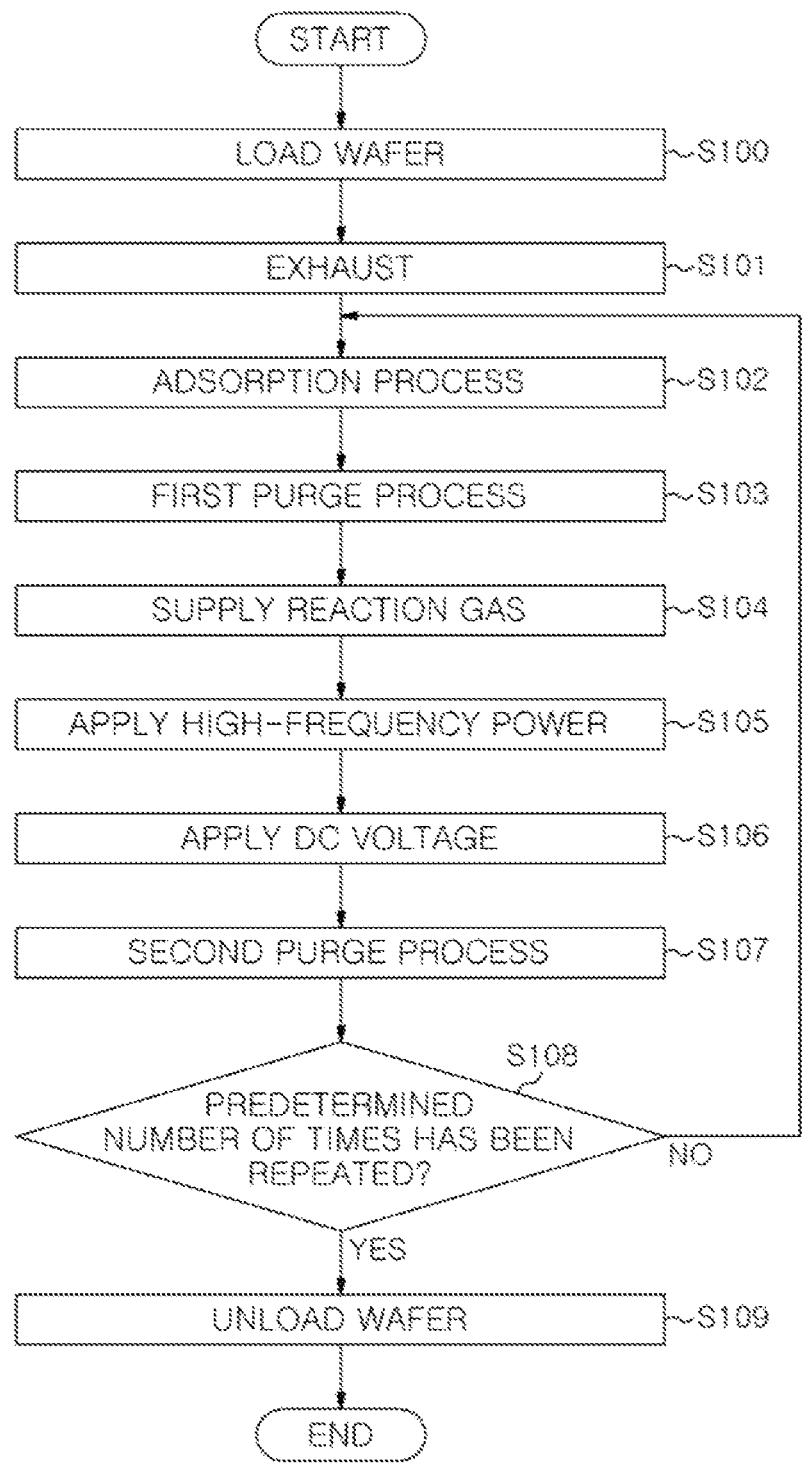
FIG. 5 is a flowchart illustrating an example of film-forming processing according to an embodiment.

Next, plasma processing performed using the plasma processing device 1 configured as described above will be described. Hereinafter, a flow of film-forming processing by plasma ALD as the plasma processing will be described. FIG. 5 is a flowchart illustrating an example of the film-forming processing according to an embodiment.

First, a gate valve G is opened and a wafer W is loaded into a processing chamber 10 by a robot arm (not shown) and is mounted on a mounting table 11 (S100). Next, the gate valve G is closed. Thereafter, a control device 100 operates an exhaust device 70 and adjusts an opening degree of an adjustment valve 72 to reduce a pressure in the processing chamber 10 to a predetermined degree of vacuum (S101).

Next, the control device 100 performs an adsorption process (S102). A raw material gas is supplied from a gas supply 51 into a gas diffusion chamber 41 through a gas supply pipe 44. The raw material gas supplied through the gas supply pipe 44 is diffused within the gas diffusion chamber 41 and supplied in a shower form into a reaction chamber 61 from each of gas discharge ports 41a. Molecules of the raw material gas supplied into the reaction chamber 61 are adsorbed on a surface of the wafer W placed on the mounting table 11. Then, the control device 100 stops the supply of the raw material gas from the gas supply 51.

Next, the control device 100 performs a first purge process (S103). In the first purge process, an inert gas is supplied from the gas supply 51 into a plasma generating chamber 42 and the gas diffusion chamber 41 through a gas supply pipe 50 and the gas supply pipe 44. The inert gas supplied into the plasma generating chamber 42 and the gas diffusion chamber 41 is supplied in a shower form into the reaction chamber 61 via through holes 40a of a partition plate 40 and through holes 60a of a second plate electrode 60. The molecules of the raw material gas excessively adsorbed on the surface of the wafer W may be removed due to the inert gas supplied to the reaction chamber 61. Then, the control device 100 stops the supply of the inert gas from the gas supply 51.

Next, the control device 100 performs a reaction process (S104 to S106). In the reaction process, a reaction gas is supplied from the gas supply 51 into the plasma generating chamber 42 through the gas supply pipe 50 (S104). The reaction gas supplied into the plasma generating chamber 42 is diffused within the plasma generating chamber 42.

Then, the control device 100 controls a first high-frequency power source 20, a switch 25, a second high-frequency power source 46, and a switch 45 to apply high-frequency power to an upper electrode 30 and a first plate electrode 43 (S105). In addition, the control device 100 controls a switch 23 to be turned on, and superimposes a negative DC voltage of a predetermined magnitude supplied from a DC power source 22 on the high-frequency power (S106). Thus, in the plasma generating chamber 42, plasma of the reaction gas is generated. An active species contained in the generated plasma is supplied into the reaction chamber 61 through the through holes 40*a* of the partition plate 40 and the through holes 60*a* of the second plate electrode 60. The active species supplied into the reaction chamber 61 reacts with the molecules of the raw material gas above the wafer W to form a film on the wafer W. Then, the control device 100 stops the supply of the reaction gas from the gas supply 51. Further, the control device 100 controls the first high-frequency power source 20 and the second high-frequency power source 46 to stop the application of the high-frequency power to the upper electrode 30 and the first plate electrode 43, and controls the switch 25 and the switch 45 to be turned off. In addition, the control device 100 stops the application of the negative DC voltage from the DC power source 22 to the upper electrode 30 by controlling the switch 23 to be turned off.

Next, the control device 100 performs a second purge process (S107). In the second purge process, an inert gas is supplied from the gas supply 51 into the plasma generating chamber 42 and the gas diffusion chamber 41 through the gas supply pipe 50 and the gas supply pipe 44. The inert gas supplied into the plasma generating chamber 42 and the gas diffusion chamber 41 is supplied in a shower form into the reaction chamber 61 through the through holes 40*a* of the partition plate 40 and the through holes 60*a* of the second plate electrode 60. The reaction gas and volatile reaction by-products remaining on the surface of the wafer W may be removed due to the inert gas supplied to the reaction chamber 61. Then, the control device 100 stops the supply of the inert gas from the gas supply 51.

Next, the control device 100 determines whether the processes of operations S102 to S107 have been repeated a predetermined number of times (S108). When the processes of operations S102 to S107 have not been repeated the predetermined number of times ("No" in operation S108), the control device 100 performs the process described in operation S102 again. On the other hand, when the processes of operations S102 to S107 have been repeated the predetermined number of times ("Yes" in operation S108), the gate valve G is opened and the wafer W is unloaded from the processing chamber 10 by the robot arm (not shown) (S109). Then, the film-forming process shown in the flowchart ends.

Further, the plasma processing device 1 may supply high-frequency power from a third high-frequency power source 76 to the mounting table 11 as follows to perform a thin-film modification process, anisotropic etching, or atomic layer etching. For example, the plasma processing device 1 generates plasma in the reaction chamber 61 to perform the thin-film modification process using plasma directly. For example, the film quality of an SiN film may be improved by generating plasma while supplying $H_2$/Ar gas into the reaction chamber 61. Specifically, an etching rate is decreased. The shape of FIG. 4A may be realized by isotropic etching without increasing the film thickness as shown in FIG. 4A by irradiating H ions anisotropically and decreasing the etching rate at upper and bottom surfaces of the pattern. The timing of the modification process may be after operation S102, after operation S103, after operation S106, after operation S107, or a combination thereof. Further, the modification process may not be performed for each cycle of operations S102 to S107, and may be performed once for several cycles or once after film formation. Further, the plasma processing device 1 may perform the anisotropic etching using plasma directly by generating the plasma in the reaction chamber 61. In addition, the plasma processing device 1 may perform atomic layer etching using plasma directly by generating the plasma in the reaction chamber 61.

As described above, the plasma processing device 1 according to the present embodiment comprises the processing chamber 10, the partition plate 40, the second electrode (the upper electrode 30), and the power supply (the first high-frequency power source 20, the switch 45, the second high-frequency power source 46, or the like). The partition plate 40 has an insulating property and is configured to partition a space in the processing chamber 10 into the reaction chamber 61 in which an object to be processed (the wafer W) is mounted and the plasma generating chamber 42 in which plasma is generated. Further, the partition plate 40 includes the first electrode (the first plate electrode 43) on a surface facing the side of the plasma generating chamber 42, and has a plurality of through holes 40*a* formed therein for supplying active species contained in the plasma generated in the plasma generating chamber 42 to the reaction chamber 61. The second electrode is disposed in the plasma generating chamber 42 so as to face the first electrode. The power supply is configured to supply high-frequency power obtained by phase-controlling and superimposing high-frequency powers of a plurality of frequencies to one of the first electrode and the second electrode when the plasma is generated in the plasma generating chamber 42. As a result, the plasma processing device 1 can adjust the density of ions to be irradiated to the object to be processed.

Further, the power supply supplies the high-frequency power, which is obtained by phase-controlling and superimposing the high-frequency powers of a plurality of frequencies, to the first electrode and supplies high-frequency power of a single frequency to the second electrode. As a result, the plasma processing device 1 can control the ion transmittance with good controllability and can adjust the density of ions entering the reaction chamber 61.

Further, the power supply supplies the high-frequency power, which is obtained by phase-controlling and superimposing the high-frequency powers of a plurality of frequencies, and high-frequency power of a single frequency to the second electrode and connects the first electrode to a ground (GND 48) or an LC circuit 47. As a result, the plasma processing device 1 can adjust the amount of ions to be blocked and can perform dissociation control of radicals.

Further, the power supply supplies the high-frequency power, which is obtained by phase-controlling and superimposing the high-frequency powers of a plurality of frequencies, to the second electrode and connects the second electrode to a ground or an LC circuit 47. As a result, the plasma processing device 1 can adjust the amount of ions to be blocked and can perform dissociation control of radicals.

Further, the power supply supplies high-frequency power of a single frequency to the second electrode, and supplies the high-frequency power obtained by phase-controlling and superimposing the high-frequency powers of a plurality of frequencies to the first electrode. As a result, the plasma processing device 1 can adjust the amount of ions to be blocked and can perform dissociation control of radicals.

Further, the power supply connects the second electrode to a ground (GND 29) or an LC circuit 28 and supplies the high-frequency power, which is obtained by phase-controlling and superimposing the high-frequency powers of a plurality of frequencies, and high-frequency power of a single frequency to the first electrode. As a result, the plasma processing device 1 can control the ion transmittance with good controllability and can adjust the density of ions entering the reaction chamber 61.

Further, the power supply connects the second electrode to a ground (GND 29) or an LC circuit 28 and supplies the high-frequency power obtained by phase-controlling and superimposing the high-frequency powers of a plurality of frequencies to the first electrode. As a result, the plasma processing device 1 can control the ion transmittance with good controllability and can adjust the density of ions entering into the reaction chamber 61.

Further, the plasma processing device 1 further comprises a gas supply 51. The gas supply 51 is configured to supply a raw material gas for film formation to the reaction chamber 61 to adsorb molecules of the raw material gas on a surface of the object to be processed and then supply reaction gas that reacts with the molecules of the raw material gas to the plasma generating chamber 42. The power supply supplies the high-frequency power obtained by phase-controlling and superimposing the high-frequency powers of a plurality of frequencies to either one of the first electrode and the second electrode according to the supply of the reaction gas from the gas supply 51 to generate plasma of the reaction gas. As a result, the plasma processing device 1 can suppress the thinning of sidewalls of the film to be formed and the deterioration of film quality.

Further, the gas supply 51 supplies the raw material gas to the partition plate 40. A plurality of gas discharge ports 41a configured to discharge the raw material gas supplied from the gas supply 51 are formed in a surface of the partition plate 40 on the side of the reaction chamber 61. As a result, the plasma processing device 1 can suppress the flow of the raw material gas into the plasma generating chamber 42 and can suppress the formation of a film in the plasma generating chamber 42.

Further, the plasma processing device 1 further comprises a suppression unit (a second plate electrode 60). The suppression unit is provided in the reaction chamber 61 and is configured to suppress ions from penetrating into the reaction chamber 61 from the plasma generating chamber 42 through the plurality of through holes 40a. As a result, the plasma processing device 1 can suppress ions from entering the reaction chamber 61.

While the embodiments have been described above, it is to be considered that the embodiments disclosed herein are illustrative and not restrictive in all respects. In practice, the above-described embodiments may be implemented in various forms. In addition, the above-described embodiments may be omitted, substituted, and modified in various ways without departing from the scope and spirit of the appended claims.

For example, in the embodiments, the case in which the object to be processed is a semiconductor wafer has been described as an example, but the present disclosure is not limited thereto. The object to be processed may be another substrate such as a glass substrate.

Further, in the above-described embodiments, the case in which the gas supply pipe 44 for supplying a precursor and the gas diffusion chamber 41 are provided in the partition plate 40 has been described, but the present disclosure is not limited thereto. Instead of providing the gas supply pipe 44, the gas diffusion chamber 41, and the gas discharge ports 41a in the partition plate 40, the precursor, the reaction gas, and the purge gas may be alternately supplied using only the gas supply pipe 50. Further, in the above-described embodiments, the supply of the purge gas is stopped when the purge processes in operations S103 and S107 are completed, but the purge gas may be allowed to always flow in all the processes of operations S102 to S108. Further, in the above-described embodiments, the supply of the reaction gas is started in operation S104 and the supply of the reaction gas is stopped when operation S106 is completed. However, the reaction gas may be allowed to always flow in all the processes of operations S102 to S108 in the case in which a gas, such as oxygen gas in the $SiO_2$ film formation process by plasma ALD, that is inert to the precursor in a state in which plasma is not formed is used as the reaction gas.

Further, in the above-described embodiments, the case in which the processing chamber 10 is formed in a substantially cylindrical shape having a bottom and an opened upper portion, and an upper opening of the processing chamber 10 is sealed by the upper electrode 30 and the insulating member 33 has been described as an example, but the present disclosure is not limited thereto. In the processing chamber 10, the upper opening may be sealed with an insulating member, and the upper electrode 30 may be disposed on an inner surface side of the sealed insulating member.

Further, the case in which, in the plasma processing device 1 according to the above-described embodiment, a negative DC voltage is supplied to the upper electrode 30, when generating plasma has been described as an example, but the present disclosure is not limited thereto. The negative DC voltage may not be supplied to the upper electrode 30.

Further, although the plasma processing device 1 of the above-described embodiment is a device for performing plasma ALD on the wafer W, the disclosed technology may be applied to a plasma processing device other than a film-forming device. Examples of the plasma processing device other than the film-forming device may include a plasma etching device for etching the wafer W and a surface-modifying device.

DESCRIPTION OF REFERENCE NUMERALS

1: plasma processing device
10: processing chamber
20: first high-frequency power source
30: upper electrode
40: partition plate
40a: through holes
42: plasma generating chamber
43: first plate electrode
45: switch
46: second high-frequency power source
48: GND
47: LC circuit
51: gas supply
60: second plate electrode
61: reaction chamber
W: wafer

The invention claimed is:
1. A plasma processing device comprising:
a processing chamber;

a partition plate that has an insulating property, and configured to partition a space in the processing chamber into a reaction chamber in which an object to be processed is mounted and a plasma generating chamber in which plasma is generated, wherein a first electrode is provided on a surface of the partition plate on the side of the plasma generating chamber, and the partition plate has a plurality of through holes formed for supplying active species contained in the plasma generated in the plasma generating chamber to the reaction chamber;

a second electrode disposed in the plasma generating chamber so as to face the first electrode;

a power supply configured to supply high-frequency power obtained by phase-controlling and superimposing high-frequency powers of a plurality of frequencies to one of the first electrode and the second electrode when the plasma is generated in the plasma generating chamber; and a gas supply configured to supply a raw material gas for film formation to the reaction chamber to adsorb molecules of the raw material gas on a surface of the object to be processed, and then supply a reaction gas that reacts with the molecules of the raw material gas to the plasma generating chamber, wherein the power supply supplies the high-frequency power obtained by phase-controlling and superimposing the high-frequency powers of a plurality of frequencies to either one of the first electrode and the second electrode according to the supply of the reaction gas from the gas supply to generate plasma of the reaction gas.

2. The plasma processing device of claim 1, wherein the power supply supplies to the first electrode the high-frequency power obtained by phase-controlling and superimposing the high-frequency powers of a plurality of frequencies and supplies high-frequency power of a single frequency to the second electrode.

3. The plasma processing device of claim 1, wherein the power supply supplies to the second electrode the high-frequency power obtained by phase-controlling and superimposing the high-frequency powers of a plurality of frequencies and high-frequency power of a single frequency and connects the first electrode to a ground or an LC circuit.

4. The plasma processing device of claim 1, wherein the power supply supplies to the second electrode the high-frequency power obtained by phase-controlling and superimposing the high-frequency powers of a plurality of frequencies and connects the second electrode to a ground or an LC circuit.

5. The plasma processing device of claim 1, wherein the power supply supplies high-frequency power of a single frequency to the second electrode, and supplies the high-frequency power obtained by phase-controlling and superimposing the high-frequency powers of a plurality of frequencies to the first electrode.

6. The plasma processing device of claim 1, wherein the power supply connects the second electrode to a ground or an LC circuit and supplies to the first electrode the high-frequency power obtained by phase-controlling and superimposing the high-frequency powers of a plurality of frequencies and high-frequency power of a single frequency.

7. The plasma processing device of claim 1, wherein the power supply connects the second electrode to a ground or an LC circuit and supplies to the first electrode the high-frequency power obtained by phase-controlling and superimposing the high-frequency powers of a plurality of frequencies.

8. The plasma processing device of claim 1, wherein the gas supply supplies the raw material gas to the partition plate, and a plurality of gas discharge ports configured to discharge the raw material gas supplied from the gas supply are formed in a surface of the partition plate on the side of the reaction chamber.

9. The plasma processing device of claim 1, further comprising a suppression unit provided in the reaction chamber and configured to suppress ions from entering into the reaction chamber from the plasma generating chamber through the plurality of through holes.

10. A plasma processing method comprising:

supplying a raw material gas for film formation to a reaction chamber to absorb molecules of the raw material gas on a surface of an object to be processed, wherein a space in a processing chamber is partitioned into the reaction chamber, in which the object to be processed is placed, and a plasma generating chamber, in which plasma is generated, using a partition plate that has an insulating property and includes a plurality of through holes formed therein;

supplying a reaction gas that reacts with the molecules of the raw material gas into the plasma generating chamber; and converting the reaction gas into plasma by supplying high-frequency power obtained by phase-controlling and superimposing high-frequency powers of a plurality of frequencies to one of a first electrode, which is provided on a surface of the partition plate on the side of the plasma generating chamber, and a second electrode that is disposed in the plasma generating chamber so as to face the first electrode, according to the supply of the reaction gas.

* * * * *